(12) United States Patent
Lei et al.

(10) Patent No.: US 7,722,719 B2
(45) Date of Patent: May 25, 2010

(54) GAS BAFFLE AND DISTRIBUTOR FOR SEMICONDUCTOR PROCESSING CHAMBER

(75) Inventors: Lawrence Chung-Lai Lei, Milpitas, CA (US); Siqing Lu, San Jose, CA (US); Steven E. Gianoulakis, Pleasanton, CA (US); Won B. Bang, Santa Clara, CA (US); David P. Sun, Mountain View, CA (US); Yen-Kun Victor Wang, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 11/075,527

(22) Filed: Mar. 7, 2005

(65) Prior Publication Data
US 2006/0196603 A1    Sep. 7, 2006

(51) Int. Cl.
C23C 16/455 (2006.01)
C23F 1/00 (2006.01)
H01L 21/306 (2006.01)
C23C 16/06 (2006.01)
C23C 16/22 (2006.01)

(52) U.S. Cl. .............. 118/715; 156/345.33; 156/345.34
(58) Field of Classification Search ................. 118/715; 156/345.33, 345.34
See application file for complete search history.

(56) References Cited

U.S. PATENT DOCUMENTS

| | | | |
|---|---|---|---|
| 4,439,401 A * | 3/1984 | Voll et al. | 422/150 |
| 4,588,000 A | 5/1986 | Malin et al. | |
| 5,322,567 A | 6/1994 | Deaton et al. | |
| 5,441,568 A | 8/1995 | Cho et al. | |
| 5,772,771 A | 6/1998 | Li et al. | |
| 5,804,259 A * | 9/1998 | Robles | 427/577 |
| 5,851,294 A | 12/1998 | Young et al. | |
| 5,865,896 A * | 2/1999 | Nowak et al. | 118/723 I |

(Continued)

FOREIGN PATENT DOCUMENTS

EP      0 702 392 A    3/1996

(Continued)

OTHER PUBLICATIONS

Non-Final Office Action for U.S. Appl. No. 11/564,105 mailed on Jun. 10, 2008; 11 pages.

(Continued)

*Primary Examiner*—Rudy Zervigon
(74) *Attorney, Agent, or Firm*—Townsend and Townsend and Crew (57) ABSTRACT

Techniques of the present invention are directed to distribution of deposition gases onto a substrate. In one embodiment, a gas distributor for use in a processing chamber is provided. The gas distributor includes a body having a gas deflecting surface and a gas distributor face. The gas deflecting surface defines a cleaning gas pathway. The gas distributor face is disposed on an opposite side of the body from the gas deflecting surface and faces toward a substrate support member. The gas distributor face includes a raised step and at least one set of apertures through the raised step. The at least one set of apertures are adapted to distribute a deposition gas over a substrate positioned on the substrate support member.

29 Claims, 8 Drawing Sheets

U.S. PATENT DOCUMENTS

| | | | |
|---|---|---|---|
| 5,994,662 A | 11/1999 | Murugesh | |
| 6,013,155 A | 1/2000 | McMillin et al. | |
| 6,070,551 A | 6/2000 | Li et al. | |
| 6,083,344 A | 7/2000 | Hanawa et al. | |
| 6,143,078 A | 11/2000 | Ishikawa et al. | |
| 6,170,428 B1 | 1/2001 | Redeker et al. | |
| 6,217,658 B1 | 4/2001 | Orczyk et al. | |
| 6,302,965 B1* | 10/2001 | Umotoy et al. | 118/715 |
| 6,335,288 B1 | 1/2002 | Kwan et al. | |
| 6,383,964 B1* | 5/2002 | Nakahara et al. | 501/152 |
| 6,416,823 B2 | 7/2002 | Li et al. | |
| 6,444,039 B1 | 9/2002 | Nguyen | |
| 6,450,117 B1 | 9/2002 | Murugesh et al. | |
| 6,453,992 B1 | 9/2002 | Kim | |
| 6,589,610 B2 | 7/2003 | Li et al. | |
| 6,589,910 B1 | 7/2003 | Swars | |
| 6,596,653 B2 | 7/2003 | Tan et al. | |
| 6,676,760 B2 | 1/2004 | Kholodenko et al. | |
| 6,737,812 B2* | 5/2004 | Yuasa et al. | 315/111.71 |
| 6,786,973 B2* | 9/2004 | Strauch et al. | 118/715 |
| 6,800,139 B1 | 10/2004 | Shinriki et al. | |
| 6,821,910 B2* | 11/2004 | Adomaitis et al. | 438/758 |
| 6,884,296 B2 | 4/2005 | Basceri et al. | |
| 6,960,262 B2 | 11/2005 | Sasaki et al. | |
| 6,989,061 B2* | 1/2006 | DeMent et al. | 118/300 |
| 7,105,060 B2 | 9/2006 | Shimogaki et al. | |
| 7,183,227 B1 | 2/2007 | Rasheed et al. | |
| 7,294,207 B2* | 11/2007 | Strauch et al. | 118/715 |
| 7,316,761 B2 | 1/2008 | Doan et al. | |
| 7,510,624 B2* | 3/2009 | Liang et al. | 156/345.33 |
| 2001/0033900 A1 | 10/2001 | M'Saad et al. | |
| 2002/0039625 A1 | 4/2002 | Powell et al. | |
| 2002/0187655 A1 | 12/2002 | Tan et al. | |
| 2003/0159656 A1 | 8/2003 | Tan et al. | |
| 2003/0177977 A1* | 9/2003 | Strauch et al. | 117/84 |
| 2004/0060514 A1 | 4/2004 | Janakiraman et al. | |
| 2004/0126952 A1 | 7/2004 | Gondhalekar et al. | |
| 2004/0231798 A1 | 11/2004 | Gondhalekar et al. | |
| 2005/0000441 A1* | 1/2005 | Kaeppeler et al. | 118/723 E |
| 2005/0218115 A1 | 10/2005 | Lei et al. | |
| 2006/0048707 A1 | 3/2006 | Lei et al. | |
| 2006/0075967 A1 | 4/2006 | Lu et al. | |
| 2006/0130756 A1 | 6/2006 | Liang et al. | |
| 2006/0196410 A1 | 9/2006 | Hishitani et al. | |
| 2006/0196420 A1* | 9/2006 | Ushakov et al. | 118/715 |
| 2006/0196603 A1 | 9/2006 | Lei et al. | |
| 2008/0121177 A1* | 5/2008 | Bang et al. | 118/723 I |
| 2008/0121178 A1* | 5/2008 | Bang et al. | 118/723 I |
| 2008/0121179 A1* | 5/2008 | Park et al. | 118/723 R |
| 2008/0124944 A1* | 5/2008 | Park et al. | 438/778 |
| 2008/0185284 A1 | 8/2008 | Chen et al. | |
| 2008/0188087 A1 | 8/2008 | Chen et al. | |
| 2008/0188090 A1 | 8/2008 | Chen et al. | |
| 2009/0042407 A1 | 2/2009 | Bang et al. | |
| 2009/0093129 A1 | 4/2009 | Park et al. | |

FOREIGN PATENT DOCUMENTS

| | | | |
|---|---|---|---|
| JP | 55-166926 A | | 12/1980 |
| JP | 2006310481 A | * | 11/2006 |
| JP | 2007305890 A | * | 11/2007 |
| WO | WO 2006/096674 A1 | | 9/2006 |

OTHER PUBLICATIONS

Notice of Allowance for U.S. Appl. No. 11/016,166 mailed on Nov. 25, 2008; 9 pages.

Non-Final Office Action for U.S. Appl. No. 11/564,122 mailed on Jan. 6, 2010; 17 pages.

Non-Final Office Action for U.S. Appl. No. 11/564,150 mailed on Jan. 6, 2010; 20 pages.

Non-Final Office Action for U.S. Appl. No. 12/253,687 mailed on Dec. 31, 2010; 9 pages.

\* cited by examiner

SECTION A-A

FIG. 5F

SECTION C-C

FIG. 5G

SECTION B-B

GAS BAFFLE AND DISTRIBUTOR FOR SEMICONDUCTOR PROCESSING CHAMBER

BACKGROUND OF THE INVENTION

The present invention relates generally to semiconductor manufacturing and, more particularly, to top gas baffle and distributor for delivering gases in semiconductor processing chambers.

Chemical vapor deposition (CVD) is a gas reaction process used in the semiconductor industry to form thin layers or films of desired materials on a substrate. Some high density plasma (HDP) enhanced CVD processes use a reactive chemical gas along with physical ion generation through the use of an RF generated plasma to enhance the film deposition by attraction of the positively charged plasma ions onto a negatively biased substrate surface at angles near the vertical to the surface, or at preferred angles to the surface by directional biasing of the substrate surface. One goal in the fabrication of integrated circuits (ICs) is to form very thin, yet uniform films onto substrates, at a high throughput. Many factors, such as the type and geometry of the power source and geometry, the gas distribution system and related exhaust, substrate heating and cooling, chamber construction, design, and symmetry, composition and temperature control of chamber surfaces, and material build up in the chamber, must be taken into consideration when evaluating a process system as well as a process which is performed by the system.

Uneven gas distribution is one problem encountered in semiconductor fabrication, which affects deposition uniformity. In one known chamber configuration, a gas plenum is provided around the perimeter of a processing region and a plurality of nozzles extend radially inwardly to provide gases to the substrate surface. A challenge in such a design is to evenly distribute gases across the substrate surface so that more gas is not provided towards the edge of the substrate than towards the center of the substrate. A top gas nozzle, positioned directly above the substrate support member, can be used to improve deposition uniformity.

Despite the improvements obtainable by using of a top gas nozzle further improvements and/or alternative techniques are desirable for increasing uniformity of gas distribution on the surface of a substrate.

BRIEF SUMMARY OF THE INVENTION

The present invention provides techniques including a method of introducing a gas into a chamber and an apparatus for processing semiconductors. More particularly, embodiments of the present invention are directed to increasing uniformity of a process gas onto a substrate in a semiconductor processing chamber.

In one embodiment of the present invention, a gas distributor includes a body having an upper surface adapted to outwardly direct gas away from the body and a lower surface opposite the upper surface. The lower surface has central portion and a recessed peripheral portion separated from the central portion by a step surface. The body further including a gas inlet, a plurality of gas outlets disposed in the step surface and a gas passage connecting the inlet to the plurality of gas outlets.

In yet another embodiment of the present invention, a substrate processing chamber includes an enclosure having a ceiling and a sidewall and a substrate support capable of supporting a substrate. A gas distributor is positioned centrally above the substrate support. The gas distributor comprising a body including a baffle having an upper surface adapted to outwardly direct gas away from the body and towards the enclosure sidewall, and a lower surface opposite the upper surface and spaced apart from the substrate support. The lower surface has a central portion and a recessed peripheral portion separated from the central portion by a step surface. The body further includes a gas inlet, a plurality of gas outlets disposed in the step surface, and a gas passage connecting the inlet to the plurality of gas outlets.

DETAILED DESCRIPTION OF THE INVENTION

The present invention provides techniques including a method of introducing a gas into a chamber and an apparatus for processing semiconductors. More particularly, embodiments of the present invention are directed to increasing uniformity of a process gas onto a substrate in a semiconductor processing chamber.

Figure 1:
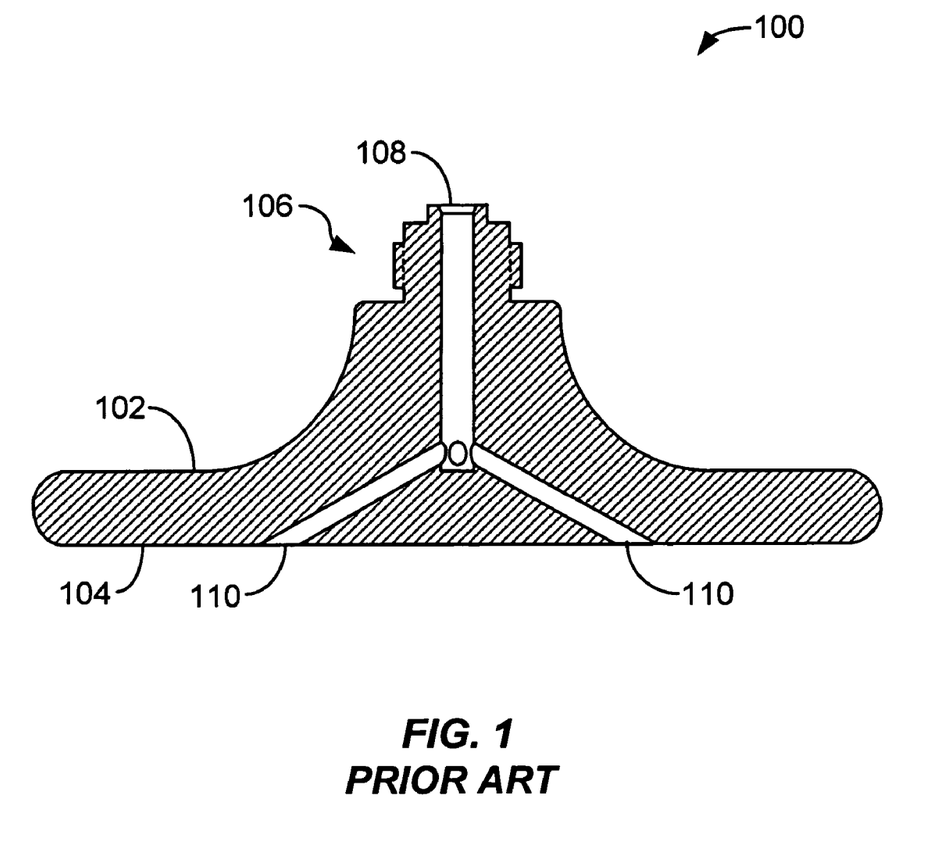
FIG. 1 is a cross-sectional view of a previously known gas distributor.

FIG. 1 is cross-sectional view of previously known gas distributor for semiconductor processing. FIG. 1 shows a gas distributor 100 having a gas deflecting surface 102 and a gas distributor face 104. Gas deflecting surface 102 provides a pathway for cleaning gases during a chamber clean process. Cleaning gases are directed by contoured surface 102 to the chamber walls instead of a substrate support member (not shown) located directly below the gas distributor. The gas distributor 100 is connected to a chamber wall at a proximal portion 106. A deposition gas can be supplied to the gas distributor 100 at the proximal end 108. A set of apertures 110 are disposed on the gas distributor face 104 to deliver deposition gases during CVD processes.

Figure 2:
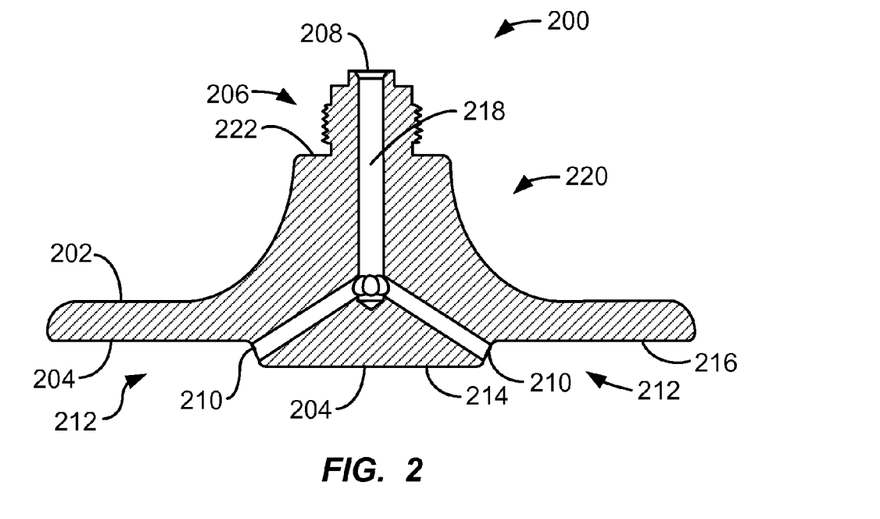
FIG. 2 is a cross-sectional view of a gas distributor according to an embodiment of the present invention.

FIG. 2 is a cross-sectional view of a gas distributor according to one embodiment of the present invention. This diagram is merely an example, which should not unduly limit the scope of the claims herein. One of ordinary skill in the art would recognize other variations, modifications, and alternatives. As shown, the present invention provides a gas distributor 200 for introducing a gas into a semiconductor processing chamber. Gas distributor 200 can be made of any suitable material such as aluminum oxide ($Al_2O_3$), aluminum nitride (AlN), silicon carbide (SiC), zirconium, quartz, sapphire or the like. In this example, gas distributor 200 is a single piece.

Gas distributor 200 has a proximal end 208 and a distal face, or gas distributor face 204. A central section 220 extends between proximal end 208 and gas distributor face 204. A lateral seat 222 is disposed between a threaded portion 206 and the central section 220. Central section 220 includes a concavely curved gas deflecting surface 202 extending from an outer periphery of the lateral seat 222 outward and toward the distal face. Gas deflecting surface 202 provides a pathway for cleaning gases during a chamber clean process. Cleaning gases are directed to the chamber walls instead of a substrate support member (not shown) located directly below the gas distributor. The gas distributor 200 is connected to a chamber wall at a threaded portion, or proximal portion 206. During a CVD process, a deposition gas is supplied to the gas distributor 200 at the gas inlet, or proximal end 208. This deposition gas flows through gas passage 218 of gas distributor 200, exiting at gas outlets, or apertures 210, and onto a substrate position on the substrate support member.

As illustrated in FIG. 2, apertures 210 are disposed on the gas distributor face 204 at inclined step surface 212, which separates a central flat portion, or raised surface 214, from a recessed peripheral flat portion 216 of face 204. Step 212 can form an oval level or, more preferably, a circular level on gas distributor face 204 having a predetermined diameter. The diameter can range from about 0.01 inches to about 3.00 inches. Step 212 can have a vertical height in a range of about 0.60 inches to about 0.75 inches, and have a slope in a range of about 90 deg to about 15 deg. Step 212 improves gas distribution of gas distributor 200. In particular, the deposition gas can be dispersed further out to the periphery of the substrate support member as a result of step 212. Decreasing the slope of step 212 further disperse the gas towards the outside.

In specific embodiments, gas distributor 200 can have 4, 6, 8, or more apertures 210. These apertures 210 are evenly distributed along the circumference of step 212 or, alternatively, weighted to a particular portion thereof. The placement and number of apertures 210 can be tuned for a specific application to achieve uniform distribution of deposition gas unto the substrate. Likewise, the diameter of apertures 210 can also be tuned. The diameter can be in the range of about 0.005 inches to about 0.250 inches. In a specific embodiment, the diameter of apertures 210 are 0.060 inches.

Figure 3A:
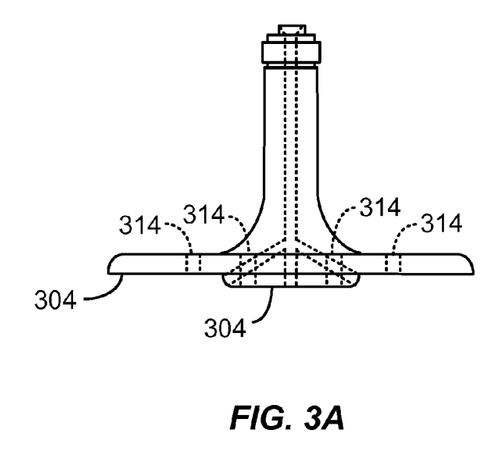
FIGS. 3A and 3B illustrate a gas distributor according to an embodiment of the invention with clean gas passages.
Figure 3B:
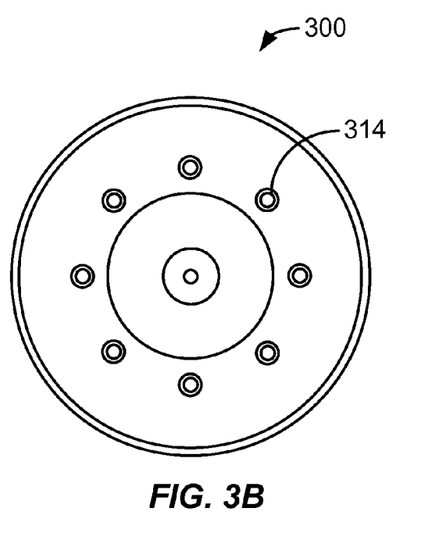

FIGS. 3A (side view) and 3B (top view) illustrate a gas distributor according to an embodiment of the invention with clean gas passages 314. Clean gas passages 314 permit a portion of the cleaning gas during a chamber clean process to pass through gas distributor 300 to gas distributor face 304. Thus, gas distributor face 304 can be more readily cleaned. There are eight clean gas passages 314 in this specific embodiment. However, in alternative embodiment, the number of clean gas passages can be up to about 50 passages. The diameter of each clean gas passage 314 is about 0.06 to about 0.25 inches to allow for efficient cleaning of the gas distributor face 204.

Figure 4A:
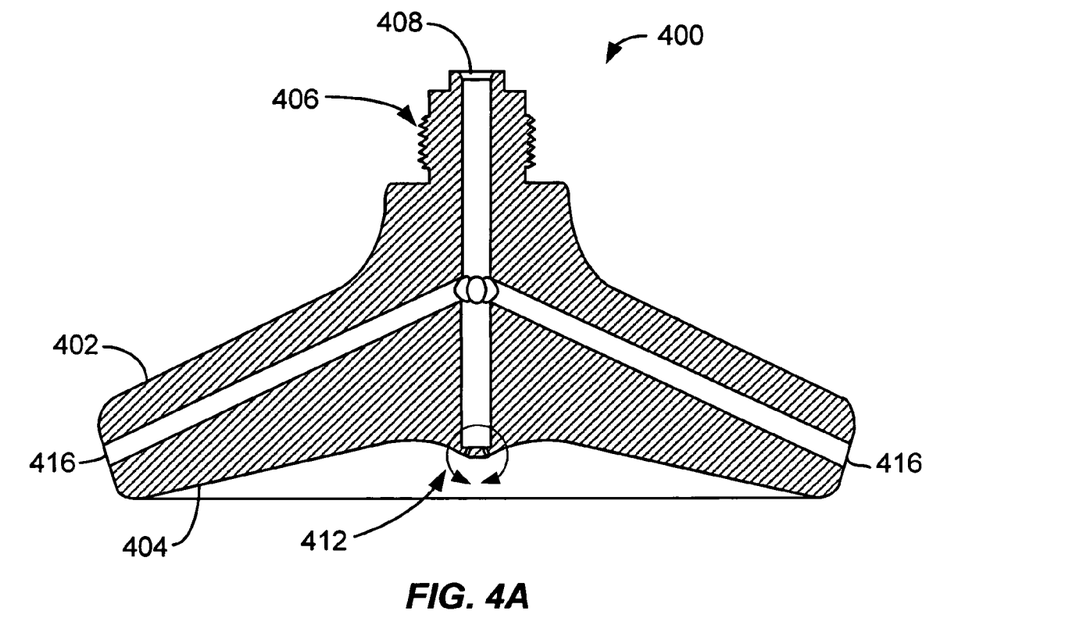
FIGS. 4A and 4B are cross-sectional views of a gas distributor according to another embodiment of the invention.
Figure 4B:
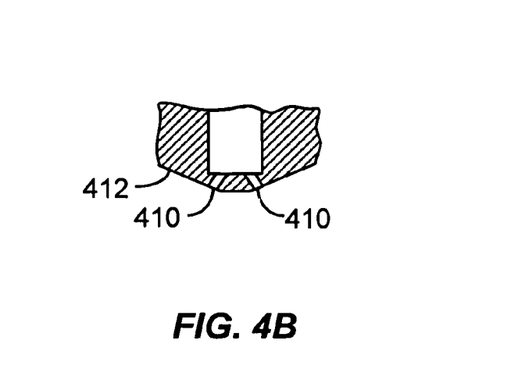
Figure 5A:
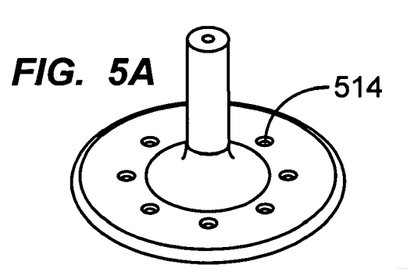
FIGS. 5A, 5B, 5C, 5D, 5E, 5F, and 5G show various views and cross-sectional views a gas distributor according to yet another embodiment of the invention.
Figure 5B:
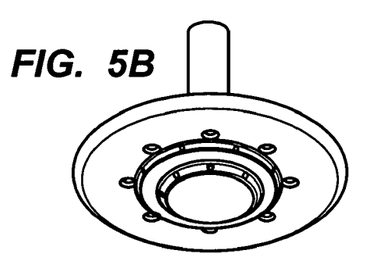
Figure 5C:
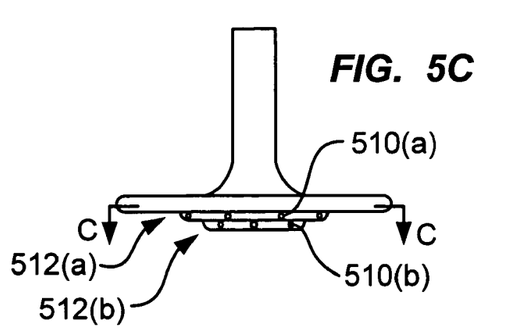
Figure 5D:
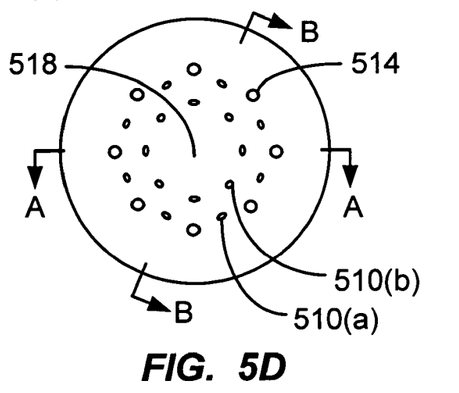
Figure 5E:
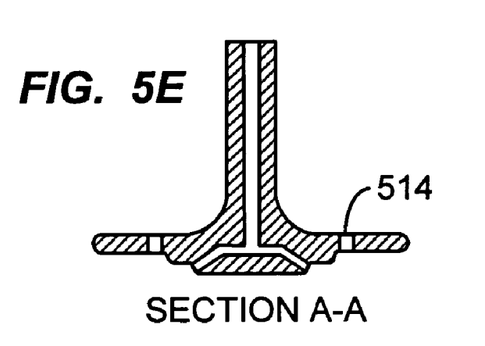
Figure 5F:
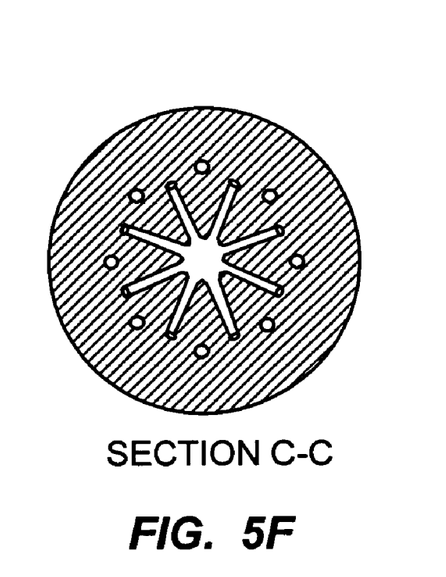
Figure 5G:
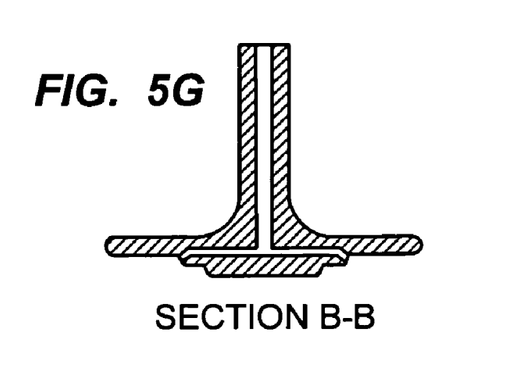

FIG. 4A is a cross-sectional view of a gas distributor 400 according to another embodiment of the invention. Single piece gas distributor 400 has a gas deflecting surface 402 and a gas distributor face 404. Gas distributor 400 is connected to a chamber wall at a proximal portion 406. During a CVD process, a deposition gas is supplied to the gas distributor 400 at the proximal end 408. This deposition gas flows through gas distributor 400, exiting at apertures 410 and feed holes 416, and onto a substrate position on a substrate support member (not shown). As illustrated in FIG. 4B, apertures 410 are disposed on the gas distributor face 404 at a step 412, and feed holes 416 are disposed at the lateral ends of gas distributor 400. Feed holes 416 provide for increased deposition at the edges of the substrate to compliment apertures 410 for uniform distribution. The number, placement, and circumference of feed holes 416 and apertures 410 can be tuned for a particular application. In one specific embodiment, gas distributor 400 includes eight feed holes 416 and four apertures 410. In other embodiments, gas distributor 400 can have feed holes 416 without apertures 410. Alternatively, gas distributor 400 may include apertures 410 without feed holes 416.

FIGS. 5A-5G show various views and cross-sectional views a gas distributor 500 according to yet another embodiment of the invention. Gas distributor 500 includes clean gas passages 514 and two steps, steps 512(*a*) and 512(*b*). Steps 512(*a*) and 512(*b*) on gas distributor face 504 can each incorporate a set of apertures. The increased number of steps allows further tuning of gas distribution to improve uniformity. The number and position of apertures included in step 512(*a*) can differ from step 512(*b*). For example, apertures 510(*a*) and 510(*b*) are not aligned in a radial direction from the center point 518.

Figure 6:
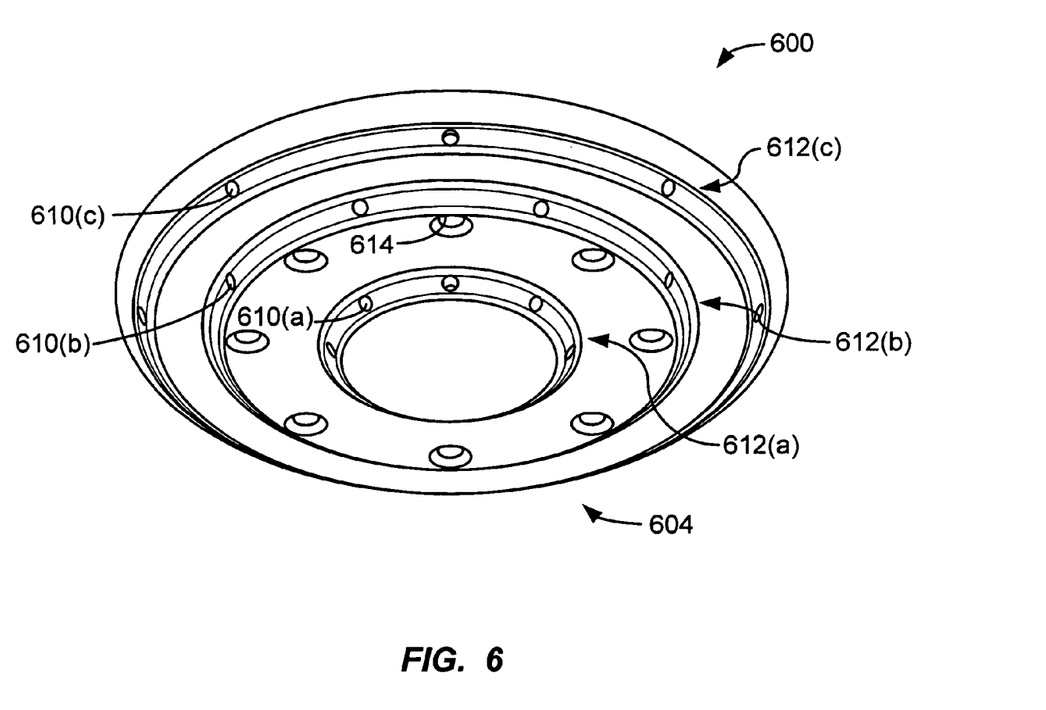
FIG. 6 illustrates a three step gas distributor according to an embodiment of the invention.

FIG. 6 illustrates a three step gas distributor 600 according to an embodiment of the invention. Gas distributor face 604 includes steps 612(*a*)-(*c*), each with a set of apertures 610(*a*)-(*c*) respectively. The three steps provide three zone of control for increased refinement of gas distribution. In addition, due to the shorter length of each aperture, the diameter of apertures 612 can be reduced for improved distribution control. In one specific embodiment, gas distributor 600 is a two piece plenum. In should be noted that other embodiments of the present invention can include 4, 5, 6, or more steps.

Figure 7A:
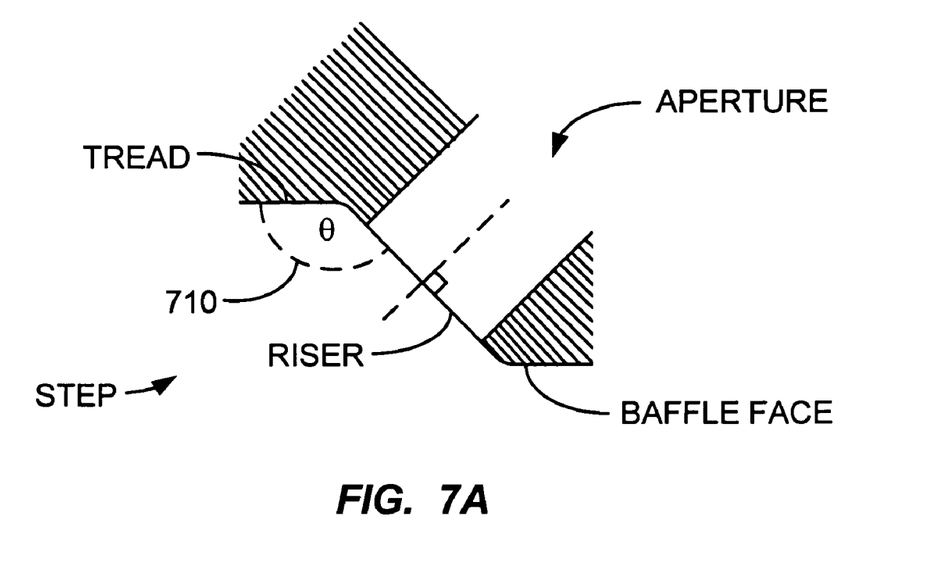
FIGS. 7A and 7B are cross-sectional views of a step for a gas distributor according embodiments of the present invention.
Figure 7B:
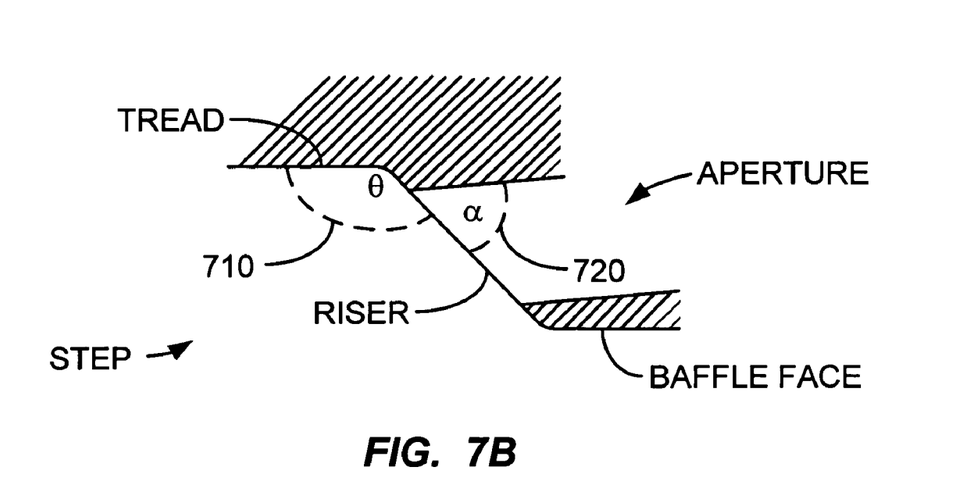

FIGS. 7A and 7B are cross-sectional views of a gas distributor step according embodiments of the present invention. In FIG. 7A, a gas distributor step includes a tread portion and a riser portion on a gas distributor face. The riser portion may be perpendicular to the tread portion, or preferably at an angle 710. Angle 710 can be in the range of about 90 degrees to about 180 degrees. In specific embodiment, angle 710 is about 45 degrees. An aperture on the gas distributor face is disposed on the riser portion of the step. The aperture is perpendicular to the riser portion (having the hole perpendicular to the riser makes the machining of the hole more true with less vibration) or, alternatively, as depicted in FIG. 7B at an angle 720. Angle 720 can, for example, range from about 15 degrees to about 120 degrees.

Figure 8:
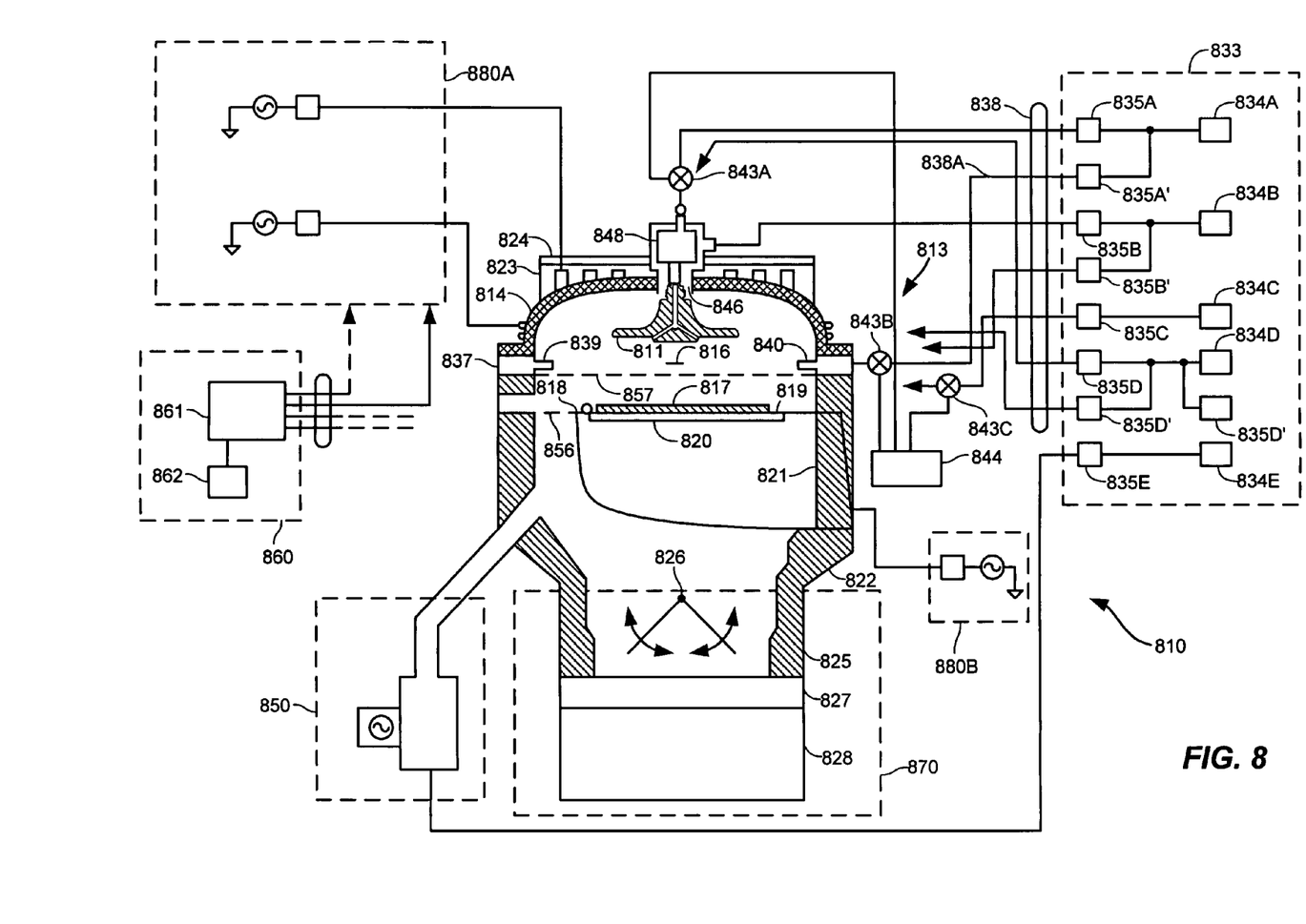
FIG. 8 illustrates an exemplary processing chamber having a gas distributor according to an embodiment of the invention.

FIG. 8 illustrates an exemplary processing chamber system having a gas distributor 811 according to an embodiment of the invention. FIG. 8 schematically illustrates the structure of an exemplary HDP-CVD system 810 in one embodiment. The system 810 includes a chamber 813, a vacuum system 870, a source plasma system 880A, a bias plasma system 880B, a gas delivery system 833, and a remote plasma cleaning system 850.

The upper portion of chamber 813 includes a dome 814, which is made of a ceramic dielectric material, such as aluminum oxide or aluminum nitride, sapphire, SiC or quartz. A heater plate 823 and a cold plate 824 surmount, and are thermally coupled to, dome 814. Heater plate 823 and cold plate 824 allow control of the dome temperature to within about ±10° C. over a range of about 100° C. to 200° C. Dome 814 defines an upper boundary of a plasma processing region 816. Plasma processing region 816 is bounded on the bottom by the upper surface of a substrate 817 and a substrate support member 818.

The lower portion of chamber 813 includes a body member 822, which joins the chamber to the vacuum system. A base portion 821 of substrate support member 818 is mounted on, and forms a continuous inner surface with, body member 822. Substrates are transferred into and out of chamber 813 by a robot blade (not shown) through an insertion/removal opening (not shown) in the side of chamber 813. Lift pins (not shown) are raised and then lowered under the control of a motor (also not shown) to move the substrate from the robot blade at an upper loading position 857 to a lower processing position 856 in which the substrate is placed on a substrate receiving portion 819 of substrate support member 818. Substrate receiving portion 819 includes an electrostatic chuck 820 that secures the substrate to substrate support member 818 during substrate processing. In a preferred embodiment, substrate support member 818 is made from an aluminum oxide or aluminum ceramic material.

Vacuum system 870 includes throttle body 825, which houses twin-blade throttle valve 826 and is attached to gate valve 827 and turbo-molecular pump 828. It should be noted that throttle body 825 offers minimum obstruction to gas flow, and allows symmetric pumping. Gate valve 827 can isolate pump 828 from throttle body 825, and can also control chamber pressure by restricting the exhaust flow capacity when throttle valve 826 is fully open. The arrangement of the throttle valve, gate valve, and turbo-molecular pump allow accurate and stable control of chamber pressures from between about 1 millitorr to about 2 torr.

A gas delivery system 833 provides gases from several sources, 834A-834E chamber for processing the substrate via gas delivery lines 838 (only some of which are shown). As would be understood by a person of skill in the art, the actual sources used for sources 834A-834E and the actual connection of delivery lines 838 to chamber 813 varies depending on the deposition and cleaning processes executed within chamber 813. Gases are introduced into chamber 813 through a gas ring 837 and/or a gas distributor 811.

In one embodiment, first and second gas sources, 834A and 834B, and first and second gas flow controllers, 835A' and 835B', provide gas to ring plenum in gas ring 837 via gas delivery lines 838 (only some of which are shown). Gas ring 837 has a plurality of source gas nozzles 839 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 837 has 12 source gas nozzles made from an aluminum oxide ceramic.

Gas ring 837 also has a plurality of oxidizer gas nozzles 840 (only one of which is shown), which in a preferred embodiment are co-planar with and shorter than source gas nozzles 839, and in one embodiment receive gas from body plenum. In some embodiments it is desirable not to mix source gases and oxidizer gases before injecting the gases into chamber 813. In other embodiments, oxidizer gas and source gas may be mixed prior to injecting the gases into chamber 813 by providing apertures (not shown) between body plenum and gas ring plenum. In one embodiment, third, fourth, and fifth gas sources, 834C, 834D, and 834D', and third and fourth gas flow controllers, 835C and 835D', provide gas to body plenum via gas delivery lines 838. Additional valves, such as 843B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 843B, to isolate chamber 813 from delivery line 838A and to vent delivery line 838A to vacuum foreline 844, for example. As shown in FIG. 8, other similar valves, such as 843A and 843C, may be incorporated on other gas delivery lines.

Referring again to FIG. 8, chamber 813 also has gas distributor 811 and top vent 846. Gas distributor 811 and top vent 846 allow independent control of top and side flows of the gases, which improves film uniformity and allows fine adjustment of the film's deposition and doping parameters. Top vent 846 is an annular opening around gas distributor 811. Gas distributor 811 includes a plurality of apertures in a step according to an embodiment of the present invention for improved gas distribution. In one embodiment, first gas source 834A supplies source gas nozzles 839 and gas distributor 811. Source nozzle MFC 835A' controls the amount of gas delivered to source gas nozzles 839 and top nozzle MFC 835A controls the amount of gas delivered to gas distributor 811. Similarly, two MFCs 835B and 835B' may be used to control the flow of oxygen to both top vent 846 and oxidizer gas nozzles 840 from a single source of oxygen, such as source 834B. The gases supplied to gas distributor 811 and top vent 846 may be kept separate prior to flowing the gases into chamber 813, or the gases may be mixed in top plenum 848 before they flow into chamber 813. Separate sources of the same gas may be used to supply various portions of the chamber.

System controller 860 controls the operation of system 810. In a preferred embodiment, controller 860 includes a memory 862, such as a hard disk drive, a floppy disk drive (not shown), and a card rack (not shown) coupled to a processor 861. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 860 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT"), and a light pen.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A gas distributor for use in a processing chamber, the gas distributor comprising:

a body having a threaded section configured to be coupled with a gas supply, the body also having a distal face and a central section extending between the threaded section and the distal face, the body further including a gas inlet, a plurality of gas outlets and a gas passage extending through the threaded section and the central section connecting the gas inlet to the plurality of gas outlets, the body further including a lateral seat disposed between the threaded section and the central section, the lateral seat extending outward from the body to an outer periphery of the lateral seat, wherein the central section includes a concavely curved gas deflecting surface extending from the outer periphery of the lateral seat outward from the body and toward the distal face, and wherein the distal face includes a continuous surface having a central flat portion and a recessed peripheral flat portion separated from the central flat portion by an inclined step surface, wherein the central flat portion extends radially from a center of the distal face to the inclined step surface and has a diameter of between about 0.01 to 3 inches, and the recessed peripheral flat portion is recessed relative to the central flat portion and the plurality of gas outlets are disposed in the inclined step surface.

2. The gas distributor of claim 1 wherein the gas distributor is a single piece.

3. The gas distributor of claim 1 wherein the gas distributor comprises at least one of aluminum oxide, aluminum nitride, sapphire and silicon carbide.

4. The gas distributor of claim 1 wherein the inclined step surface forms a circle on the distal face, and the plurality of gas outlets are evenly distributed around the inclined step surface.

5. The gas distributor of claim 1 wherein the plurality of gas outlets and the inclined step surface are sloped at about the same angle.

6. The gas distributor of claim 1 wherein the concavely curved gas deflecting surface is curved to direct a cleaning gas towards a wall of the processing chamber.

7. The gas distributor of claim 1 wherein the concavely curved gas deflecting surface is curved to divert a cleaning gas away from a substrate support member.

8. The gas distributor of claim 1 wherein a slope of the inclined step surface is in a range of about 90 degrees to about 180 degrees.

9. The gas distributor of claim 1 wherein each of the plurality of gas outlets are in a range of about 90 degrees to about 20 degrees to a riser.

10. The gas distributor of claim 1 further comprising at least one clean gas passageway extending between the concavely curved gas deflecting surface and the distal face.

11. The gas distributor of claim 1 wherein the plurality of gas outlets includes at least eight apertures.

12. The gas distributor of claim 1 further comprising a second inclined step surface and at least a second plurality of gas outlets through the second inclined step surface.

13. A substrate processing chamber, the chamber comprising:
an enclosure having a ceiling and a sidewall;
a substrate support capable of supporting a substrate;
a gas distributor positioned centrally above and extending towards the substrate support from the ceiling, the gas distributor comprising a body having a threaded section configured to be coupled with a gas supply, the body also having a distal face and a central section extending between the threaded section and distal face, the body further including a gas inlet, a plurality of gas outlets and a gas passage extending through the threaded section and the central section connecting the gas inlet to the plurality of gas outlets, the body further including a lateral seat disposed between the threaded section and the central section, the lateral seat extending outward from the body to an outer periphery of the lateral seat, wherein the central section includes a concavely curved gas deflecting surface extending from the outer periphery of the lateral seat outward from the body and toward the distal face, and wherein the distal face includes a continuous surface having a central flat portion and a recessed peripheral flat portion separated from the central flat portion by an inclined step surface, wherein the central flat portion extends radially from a center of the distal face to the inclined step surface and has a diameter of between about 0.01 to 3 inches, and the recessed peripheral flat portion is recessed relative to the central flat portion and the plurality of gas outlets are disposed in the inclined step surface.

14. The substrate processing chamber of claim 13 further comprising a top vent disposed around a portion of the body and defining an annular gas passageway adapted to direct gas towards the concavely curved gas deflecting surface.

15. The substrate processing chamber of claim 13 wherein the gas distributor is a single piece.

16. The substrate processing chamber of claim 13 wherein the gas distributor comprises at least one of aluminum oxide or aluminum nitride.

17. The substrate processing chamber of claim 13 wherein the inclined step surface forms a circle on the distal face, and the plurality of gas outlets are evenly distributed around the inclined step surface.

18. The substrate processing chamber of claim 13 wherein the plurality of gas outlets and the inclined step surface are sloped at about the same angle.

19. The substrate processing chamber of claim 13 wherein the concavely curved gas deflecting surface is curved to direct a cleaning gas towards the sidewall of the chamber.

20. The substrate processing chamber of claim 13 wherein the concavely curved gas deflecting surface is curved to divert a cleaning gas away from the substrate support.

21. The substrate processing chamber of claim 13 wherein a slope of the inclined step surface is in a range of about 90 degrees to about 180 degrees.

22. The substrate processing chamber of claim 13 wherein each of the plurality of gas outlets are in a range of about 90 degrees to about 15 degrees to a riser.

23. The substrate processing chamber of claim 13 further comprising at least one clean gas passageway extending between the concavely curved gas deflecting surface and the distal face.

24. The substrate processing chamber of claim 13 wherein the plurality of gas outlets includes at least eight apertures.

25. The substrate processing chamber of claim 13 wherein the gas distributor further comprises a second inclined step surface and at least a second plurality of gas outlets through the second inclined step surface.

26. The gas distributor of claim 1 wherein the central flat portion is substantially parallel to the recessed peripheral flat portion.

27. The gas distributor of claim 1 wherein the central flat portion is disposed distally from the recessed peripheral flat portion.

28. The substrate processing chamber of claim 13 further comprising a plurality of gas nozzles positioned along the circumference of the sidewall and surrounding the substrate support, the gas nozzles adapted to flow gas inward toward the substrate support.

29. A gas distributor comprising:
a body having a threaded section with a first diameter, the body also having a distal face and a central section extending between the threaded section and the distal face, the body further including a gas inlet, a plurality of gas outlets, and a gas passage extending through the threaded section and the central section connecting the gas inlet to the plurality of gas outlets, the body further including a lateral seat disposed between the threaded section and the central section, the lateral seat extending outward from the body to an outer periphery of the lateral seat, wherein the central section includes a concavely curved gas deflecting surface extending from the outer periphery of the lateral seat outward from the body and toward the distal face, and wherein the distal face includes a continuous surface having a central flat portion and a recessed peripheral flat portion separated from the central flat portion by an inclined step surface, wherein the central flat portion extends radially from a center of the distal face to the inclined step surface, the central flat portion having a second diameter greater than the first diameter, and the recessed peripheral flat portion is recessed relative to the central flat portion and the plurality of gas outlets are disposed on the inclined step surface.

* * * * *